United States Patent
Petzsch et al.

(10) Patent No.: US 12,038,474 B2
(45) Date of Patent: Jul. 16, 2024

(54) ELECTRONIC INSTRUMENT AND SIGNAL ANALYSIS METHOD

(71) Applicant: Rohde & Schwarz GmbH & Co. KG, Munich (DE)

(72) Inventors: Sebastian Petzsch, Munich (DE); Michael Boehme, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 14 days.

(21) Appl. No.: 17/813,833

(22) Filed: Jul. 20, 2022

(65) Prior Publication Data
US 2024/0027524 A1    Jan. 25, 2024

(51) Int. Cl.
*G01R 31/28* (2006.01)

(52) U.S. Cl.
CPC .............................. *G01R 31/2889* (2013.01)

(58) Field of Classification Search
CPC .................................................. G01R 31/2889
See application file for complete search history.

(56) References Cited

U.S. PATENT DOCUMENTS

| | | | |
|---|---|---|---|
| 2016/0112883 A1* | 4/2016 | Hassan | H04B 17/318 455/422.1 |
| 2020/0341052 A1* | 10/2020 | Barthel | G01R 13/0218 |
| 2020/0344585 A1* | 10/2020 | Barthel | H04W 4/80 |
| 2021/0344579 A1* | 11/2021 | Hirschmann | H04L 43/045 |
| 2022/0163588 A1* | 5/2022 | Froelich | G01R 31/318572 |

FOREIGN PATENT DOCUMENTS

DE        102011080480 A1    2/2013

* cited by examiner

*Primary Examiner* — Eman A Alkafawi
*Assistant Examiner* — Suresh K Rajaputra
(74) *Attorney, Agent, or Firm* — CHRISTENSEN O'CONNOR JOHNSON KINDNESS PLLC

(57) ABSTRACT

An electronic instrument is described. The electronic instrument includes a transmitter circuit, wherein the transmitter circuit is configured to transmit a test signal to a device under test. The electronic instrument further includes a receiver circuit, wherein the receiver circuit is configured to receive an output signal from the device under test. The electronic instrument further includes a processing circuit, wherein the processing circuit is configured to determine at least one signal quality indicator based on the output signal received from the device under test. The at least one signal quality indicator is indicative of a signal quality of the output signal. Further, a signal analysis method of analyzing a signal received from a device under test is described.

19 Claims, 3 Drawing Sheets

ELECTRONIC INSTRUMENT AND SIGNAL ANALYSIS METHOD

FIELD OF THE DISCLOSURE

Embodiments of the present disclosure generally relate to an electronic instrument. Embodiments of the present disclosure further relate to a signal analysis method of analyzing a signal received from a device under test.

BACKGROUND

When measuring an output signal of a device under test, different effects and perturbations in the measurement chain can lead to a degradation of the measurement result, up to the point where the measurement results cannot be trusted anymore.

For example, non-linear behavior of the device under test, such as clipping of the output signal, may lead to the emergence of harmonics in the output signal that disturb the measurements.

As another example, strong dampening of a signal processed by the device under test may lead to an output signal that is dominated by noise at least in some frequency ranges, such that measurements of the output signal are impeded at least in these frequency ranges.

Modern measurement instruments may have integrated mechanisms in order to counteract these types of perturbations. However, activating these countermeasures requires that the user of the measurement instrument is aware of a problem being present, which requires a considerable amount of expertise from the user.

Moreover, these countermeasures may not be applicable over the complete relevant frequency spectrum.

Thus, there is a need for an electronic instrument as well as for a signal analysis method that are easier to operate.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

Embodiments of the present disclosure provide an electronic instrument. In an embodiment, the electronic instrument comprises a transmitter circuit configured to transmit a test signal to a device under test. The electronic instrument also comprises a receiver circuit configured to receive an output signal from the device under test. The electronic instrument further comprises a processing circuit configured to determine at least one signal quality indicator based on the output signal received from the device under test. The at least one signal quality indicator is indicative of a signal quality of the output signal.

The electronic instrument according to embodiments of the present disclosure is based on the idea to provide an easy to understand measure for the signal quality of the output signal to a user of the electronic instrument, namely the at least one signal quality indicator.

Thus, a user of the electronic instrument does not need to have expert knowledge about the device under test and/or the electronic instrument in order to judge whether measurement results obtained by the electronic instrument are trustworthy. Instead, the user can rely on the signal quality indicator provided by the electronic instrument in order to judge the reliability of the measurement results.

Accordingly, a user may adapt operational parameters of the electronic instrument based on the signal quality indicator for a further set of measurements, and may easily compare measurement results of the further set of measurements with the previous measurements based on the at least one signal quality indicator.

In other words, the user may easily judge whether the adapted operational parameters of the electronic instrument improve the signal quality of the output signal.

In some embodiments, the test signal may be a continuous wave (CW) signal, i.e. the test signal may be a sinusoid having a predefined amplitude, a predefined frequency, and/or a predefined phase. However, it is to be understood that the test signal may have any other suitable shape. For example, the test signal may be a digitally modulated signal.

The test signal may be a predefined test signal. For example, the test signal may be adapted for the particular type of the device under test, such that an optimal testing of the device under test is ensured.

As the shape of the test signal, for example the frequency of the test signal, is known, wanted signal portions of the output signal can be distinguished from disturbances in the output signal, which allows for determining the at least one signal quality indicator.

In some embodiments, the device under test may comprise a signal generator configured to generate the test signal. For example, the signal generator may be or may comprise a numerically controlled oscillator.

In some embodiments, the device under test may process the test signal, thereby generating the output signal. Accordingly, the output signal may correspond to a convolution of the test signal with an impulse response of the device under test in time domain, and to a product of the test signal and the frequency response of the device under test in frequency domain.

According to an aspect of the present disclosure, the at least one signal quality indicator is indicative of, for example, a signal integrity of the output signal. For example, the processing circuit may be configured to determine one or more of the following properties of the output signal and may determine the at least one signal quality indicator based on one or more of these properties: clipping of the output signal, harmonics in the output signal, noise of the output signal, jitter of the output signal, crosstalk in the output signal, distortions of the output signal, ringing of the output signal, an error vector magnitude of the output signal, and/or a ground bounce signature of the output signal.

According to another aspect of the present disclosure, the processing circuit is configured to, for example, determine the at least one signal quality indicator based on the test signal and the output signal. In other words, the processing circuit takes both the test signal and the output signal into account for determining the at least one signal quality indicator. For example, the test signal may serve as a reference signal, wherein the processing circuit may compare the output signal with the test signal in order to determine the at least one signal quality indicator.

In an embodiment of the present disclosure, the processing circuit is configured to determine the at least one signal quality indicator for a plurality of frequency sampling points, respectively. In other words, the at least one signal quality indicator is provided for each of the plurality of frequency sampling points, for example for a predefined frequency band. Thus, an easy to understand measure for the quality of the signal, namely the at least one signal quality indicator, is provided over the plurality of frequency sampling points, such that the user can easily assess whether the measurement results are trustworthy over the frequency spectrum covered by the plurality of frequency sampling points.

For example, several different CW test signals having different frequencies may be transmitted to the device under test consecutively, and the corresponding output signals may be processed by the processing circuit, thereby determining the at least one signal quality indicator for the plurality of frequency sampling points, respectively.

Another aspect of the present disclosure provides that the electronic instrument further comprises, for example, a visualization circuit configured to generate visualization data associated with the at least one signal quality indicator. Thus, the visualization data comprises information on the at least one signal indicator. For example, the visualization data may comprise a table comprising values of the at least one signal indicator, for example a table comprising values of the at least one signal indicator over frequency, and/or a graph of the at least one signal indicator, for example a graph of the at least one signal indicator plotted over frequency.

In some embodiments, the electronic instrument may further comprise a display configured to display the visualization data generated by the visualization circuit. Accordingly, the at least one signal quality indicator is presented to the user in an illustrative way, namely by visualizing the at least one signal quality indicator on the display. Thus, it is particularly easy for the user to assess whether measurement results obtained by the electronic instrument are trustworthy.

According to an aspect of the present disclosure, the processing circuit is configured to, for example, determine the at least one signal quality indicator for a plurality of frequency sampling points, wherein the visualization data comprises a plot of the at least one signal quality indicator over the plurality of frequency sampling points. In other words, the at least one signal quality indicator is plotted over a predefined frequency spectrum covered by the plurality of frequency sampling points. Thus, it is particularly easy for the user to assess whether measurement results obtained by the electronic instrument are trustworthy over the predefined frequency spectrum. Further, it is particularly easy for the user to identify frequency ranges that are associated with a low or rather insufficient signal quality of the output signal.

In some embodiments, the processing circuit may be configured to determine measurement data associated with the output signal, wherein the visualization data further comprises information on the measurement data. In other words, the measurement data is visualized together with the at least one signal quality indicator. Thus, it is particularly easy for a user to assess which portions of the measurement data are trustworthy, and whether certain portions of the measurement data may be unreliable.

For example, the measurement data may comprise an impulse response of the device under test, a step response of the device under test, an amplitude response of the device under test, a phase response of the device under test, a frequency response of the device under test, and/or a transfer function of the device under test.

According to another aspect of the present disclosure, the processing circuit is configured to, for example, determine the at least one signal quality indicator for a plurality of frequency sampling points, wherein the visualization data comprises a plot of the at least one signal quality indicator over the plurality of frequency sampling points, and wherein the visualization data comprises a Bode plot associated with the measurement data. In other words, the visualization data comprises a plot of the amplitude response of the device under test, a plot of the phase response of the device under test, and the plot of the at least one signal quality indicator over the plurality of frequency sampling points. For example, the different plots are arranged one above the other.

Thus, a user can easily identify portions of the amplitude response and/or of the phase response of the device under test that are determined based on portions of the output signal having a low or rather insufficient signal quality. Accordingly, the user is assisted in identifying faults in the measurement setup and/or malfunctions of the device under test over the plurality of frequency sampling points.

In an embodiment of the present disclosure, the visualization data comprises at least one of a predefined threshold, a user-defined threshold, a color-coded background, a color-coded graph, a text message, or a warning sign. Accordingly, the visualization data may comprise additional information on whether a value or values of the at least one signal quality indicator is above or below the at least one (user-defined) threshold.

For example, the plot of the amplitude response of the device under test, the plot of the phase response of the device under test, and/or the plot of the at least one signal quality indicator over the plurality of frequency sampling points may have a first color, for example green, if a value of the at least one signal quality indicator is above a first (user-defined) threshold, which may indicate a sufficient signal quality for performing reliable measurements.

The plot of the amplitude response of the device under test, the plot of the phase response of the device under test, and/or the plot of the at least one signal quality indicator over the plurality of frequency sampling points may have a second color, for example red, if a value of the at least one signal quality indicator is below the first (user-defined) threshold, which may indicate an insufficient signal quality for performing reliable measurements.

As another example, a background of the plot of the amplitude response of the device under test, a background of the plot of the phase response of the device under test, and/or a background of the plot of the at least one signal quality indicator over the plurality of frequency sampling points may have a first color, for example green, if a value of the at least one signal quality indicator is above a first (user-defined) threshold, which may indicate a sufficient signal quality for performing reliable measurements.

The background of the plot of the amplitude response of the device under test, the background of the plot of the phase response of the device under test, and/or the background of the plot of the at least one signal quality indicator over the plurality of frequency sampling points may have a second color, for example red, if a value of the at least one signal quality indicator is below the first (user-defined) threshold, which may indicate an insufficient signal quality for performing reliable measurements.

However, it is to be understood that further (user-defined) thresholds may be provided, which may be associated with different categories of the signal quality of the output signal. For example, the different (user-defined) thresholds may be associated with the categories "sufficient signal quality", "moderate signal quality", and "insufficient signal quality".

The user may set the user-defined threshold(s) via a suitable user interface of the electronic instrument.

In some embodiments, the electronic instrument may further comprise a memory, configured to save the at least one signal quality indicator as well as measurement data associated with the output signal. Thus, the at least one signal quality indicator and the measurement data may be stored or otherwise saved in the memory for later processing.

The measurement data saved in the memory may comprise an impulse response of the device under test, a step response of the device under test, an amplitude response of the device under test, a phase response of the device under test, a frequency response of the device under test, and/or a transfer function of the device under test.

In some embodiments, the at least one signal quality indicator and the measurement data may be transmitted from the memory to another electronic instrument and/or to another (expert) user via a suitable network, e.g. via a local area network (LAN), a wide area network (WAN), via WLAN, or via a mobile communication network such as a 5G network.

In a further embodiment of the present disclosure, the electronic instrument is an oscilloscope. However, it is to be understood that the electronic instrument may be any other suitable type of measurement instrument, for example a signal analyzer or a vector signal analyzer.

According to an aspect of the present disclosure, the at least one signal quality indicator comprises, for example, a signal-to-noise ratio. In general, a high signal-to-noise ration may indicate that the measurement results are trustworthy. On the other hand, a low signal-to-noise ratio (for example 0 or below) indicates that the output signal comprises considerable noise or is even dominated by noise, such that the measurement results may be unreliable.

Alternatively or additionally, the at least one signal quality indicator may comprise one or more of the following measures for the signal quality of the output signal: clipping of the output signal, harmonics in the output signal, noise of the output signal, jitter of the output signal, crosstalk in the output signal, distortions of the output signal, ringing of the output signal, an error vector magnitude of the output signal, and/or a ground bounce signature of the output signal.

In some embodiments, the processing circuit may be configured to combine two or more of the signal quality indicators by a weighted sum, thereby obtaining a combined signal quality indicator. The combined signal quality indicator may be processed and visualized as described above.

Embodiments of the present disclosure further provide a signal analysis method of analyzing a signal received from a device under test. In an embodiment, the signal analysis method comprising the following steps:
- transmitting, by a transmission circuit of an electronic instrument, a test signal to a device under test;
- processing, by the device under test, the test signal, thereby generating an output signal;
- receiving, by a receiver circuit of the electronic instrument, the output signal of the device under test; and
- processing, by a processing circuit of the electronic instrument, the output signal, thereby obtaining at least one signal quality indicator, wherein the at least one signal quality indicator is indicative of a signal quality of the output signal.

In some embodiments, the electronic instrument(s) described above is/are configured to perform any of the signal analysis methods according to the present disclosure.

Regarding the further advantages and properties of the signal analysis methods, reference is made to the explanations given above with respect to the electronic instruments, which also hold for the signal analysis methods and vice versa.

In an embodiment of the present disclosure, the at least one signal quality indicator is indicative of a signal integrity of the output signal. For example, the processing circuit may determine one or more of the following properties of the output signal and may determine the at least one signal quality indicator based on one or more of these properties of the output signal: clipping of the output signal, harmonics in the output signal, noise of the output signal, jitter of the output signal, crosstalk in the output signal, distortions of the output signal, ringing of the output signal, an error vector magnitude of the output signal, and/or a ground bounce signature of the output signal.

An aspect of the present disclosure provides that the at least one signal quality indicator is, for example, determined based on the test signal and the output signal. In other words, the processing circuit takes both the test signal and the output signal into account for determining the at least one signal quality indicator.

For example, the test signal may serve as a reference signal, wherein the processing circuit may compare the output signal with the test signal in order to determine the at least one signal quality indicator.

According to another aspect of the present disclosure, the at least one signal quality indicator is, for example, determined for a plurality of frequency sampling points. In other words, the at least one signal quality indicator is provided for each of the plurality of frequency sampling points, for example for a predefined frequency band. Thus, an easy to understand measure for the quality of the signal, namely the at least one signal quality indicator, is provided over the plurality of frequency sampling points, such that the user can easily assess whether the measurement results are trustworthy over the frequency spectrum covered by the plurality of frequency sampling points.

For example, several different CW test signals having different frequencies may be transmitted to the device under test consecutively, and the corresponding output signals may be processed by the processing circuit, thereby determining the at least one signal quality indicator for the plurality of frequency sampling points, respectively.

In an embodiment of the present disclosure, visualization data associated with the at least one signal quality indicator is determined by a visualization circuit of the electronic instrument. Thus, the visualization data comprises information on the at least one signal indicator. For example, the visualization data may comprise a table comprising values of the at least one signal indicator, for example a table comprising values of the at least one signal indicator over frequency, and/or a graph of the at least one signal indicator, for example a graph of the at least one signal indicator plotted over frequency.

The visualization data may be displayed by a display of the electronic instrument. Accordingly, the at least one signal quality indicator is presented to the user in an illustrative way, namely by visualizing the at least one signal quality indicator on the display. Thus, it is particularly easy for the user to assess whether measurement results obtained by the electronic instrument are trustworthy.

In some embodiments, measurement data associated with the output signal is determined by the processing circuit, wherein the visualization data further comprises information on the measurement data. In other words, the measurement data is visualized together with the at least one signal quality indicator. Thus, it is particularly easy for a user to assess which portions of the measurement data are trustworthy, and whether certain portions of the measurement data may be unreliable.

For example, the measurement data may comprise an impulse response of the device under test, a step response of the device under test, an amplitude response of the device under test, a phase response of the device under test, a frequency response of the device under test, and/or a transfer function of the device under test.

In a further embodiment of the present disclosure, the at least one signal quality indicator is determined for a plurality of frequency sampling points, wherein the visualization data comprises a plot of the at least one signal quality indicator over the plurality of frequency sampling points, and wherein the visualization data comprises a Bode plot associated with the measurement data. In other words, the visualization data comprises a plot of the amplitude response of the device under test, a plot of the phase response of the device under test, and the plot of the at least one signal quality indicator over the plurality of frequency sampling points. For example, the different plots are arranged one above the other.

Thus, a user can easily identify portions of the amplitude response and/or of the phase response of the device under test that are determined based on portions of the output signal having a low signal quality. Accordingly, the user is assisted in identifying faults in the measurement setup and/or malfunctions of the device under test over the plurality of frequency sampling points.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Similarly, any steps described herein may be interchangeable with other steps, or combinations of steps, in order to achieve the same or substantially similar result. Moreover, some of the method steps can be carried serially or in parallel, or in any order unless specifically expressed or understood in the context of other method steps.

Figure 1:
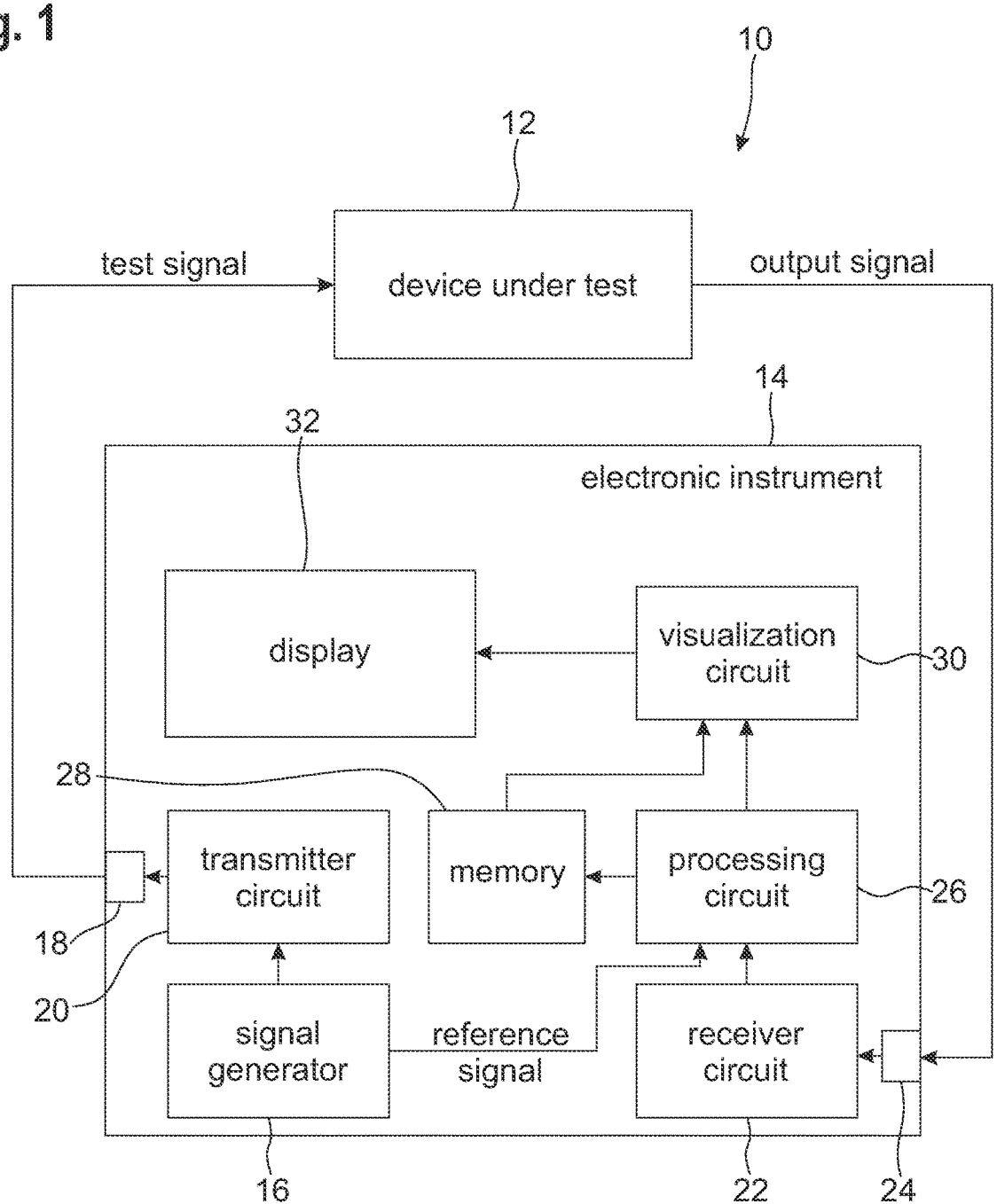
FIG. 1 schematically shows an electronic instrument according to an embodiment of the present disclosure.

FIG. 1 schematically shows a measurement system 10 comprising a device under test 12 and an electronic instrument 14. In general, the electronic instrument 14 is configured to generate a test signal and to forward the test signal to the device under test 12. The device under test 12 processes the test signal, thereby generating an output signal. The electronic instrument 14 is further configured to process and analyze the output signal in order to assess the performance of the device under test 12, as is described in more detail below.

The device under test 12 may be any electronic device that is configured to receive and process an electric signal. For example, the device under test 12 may be or comprise at least one of an amplifier, a filter, a printed circuit board (PCB), etc.

The electronic instrument 14 may be established as an oscilloscope, for example as a digital oscilloscope. However, it is to be understood that the electronic instrument 14 may be any other suitable type of measurement instrument, for example a signal analyzer or a vector signal analyzer.

The electronic instrument 14 comprises a signal generator 16, which may comprise one or more circuits, that is connected to an output 18 of the electronic instrument 14 via a transmitter circuit 20. It is noted that it is also conceivable that the signal generator 16 is established separately from the electronic instrument 14, for example as a standalone signal generator. Accordingly, the electronic instrument 14 may comprise a reference signal input for receiving a reference single from an external signal generator.

The output 18 is connected with the device under test 12 in a signal-transmitting manner. Therein and in the following, the term "connected in a signal transmitting manner" is understood to denote a cable-based or wireless connection that is configured to transmit signals between the respective devices or components.

The electronic instrument 14 also comprises a receiver circuit 22 that is connected to an input 24 of the electronic instrument 14. The input 24 is connected with the device under test 12 in a signal-transmitting manner.

The electronic instrument 14 further comprises a processing circuit 26 that is connected to the receiver circuit 22 downstream of the receiver circuit 22. A memory 28 and a visualization circuit 30 are provided downstream of the processing circuit 26, respectively. In some embodiments, the electronic instrument 14 further comprises a display 32 that is provided downstream of the visualization circuit 30.

The functionality of the individual components is described in more detail hereinafter.

Figure 2:
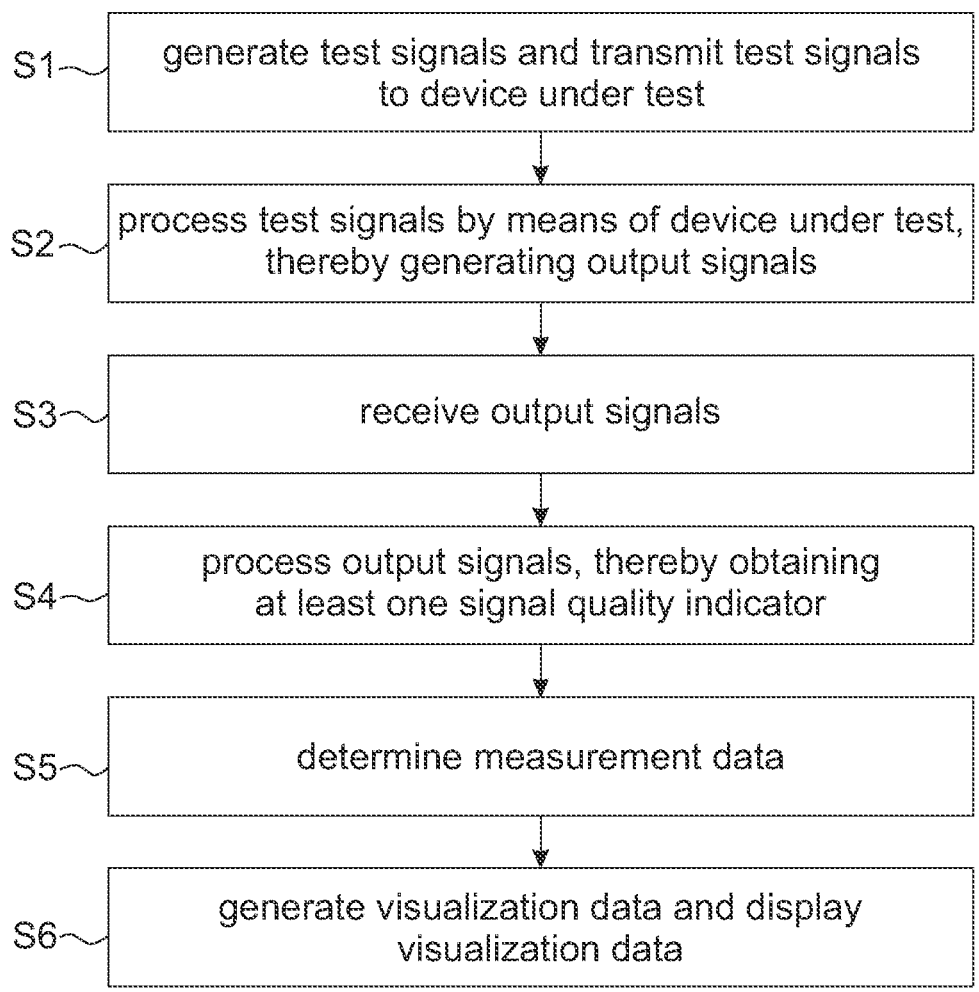
FIG. 2 shows a flow chart of a signal analysis method according to an embodiment of the present disclosure.

The electronic instrument 14 is configured to perform a signal analysis method of analyzing a signal received from the device under test 12, an example of which is described in the following with reference to FIG. 2.

A test signal is generated by the signal generator 16 and forwarded to the device under test 12 by the transmitter circuit 20 and the output 18 (step S1). For example, a plurality of test signals having different frequencies may be generated consecutively and forwarded to the device under test 12.

In general, the test signals each may be a continuous wave (CW) signal. Thus, the test signals each may be a predefined sinusoid having a predefined amplitude, a predefined frequency, and/or a predefined phase. Without restriction of generality, this case is described in the following.

For example, different test signals may have different frequencies, such that a predefined frequency spectrum is covered by the test signals forwarded to the device under test 12. However, it is to be understood that the test signal(s) may have any other suitable shape. For example, the test signal(s) may be a digitally modulated signal.

Further, a reference signal or a plurality of reference signals corresponding to the test signals may be generated by the signal generator 16, wherein the reference signals are transmitted to the processing circuit 26.

The reference signals may be a copy of the corresponding test signal, respectively. However, the reference signal(s) may be any other suitable type of reference signal.

The test signals are processed by the device under test 12, thereby generating output signals corresponding to the test signals (step S2). The output signals correspond to a convolution of the respective test signal with an impulse response of the device under test 12 in time domain. In frequency domain, the output signals correspond to a product of the respective test signal and the frequency response of the device under test 12. Accordingly, the device under test 12 manipulates the amplitudes and/or the phases of the test signals in a predefined manner that is described by the frequency response of the device under test 12, thereby generating the output signals.

The output signals are received by the input 24 and the receiver circuit 22, and the output signals are forwarded to the processing circuit 26 (step S3). The output signals are processed by the processing circuit 26, thereby obtaining at least one signal quality indicator (step S4). For example, the plurality of output signals is processed by the processing circuit 26, thereby obtaining the at least one signal quality indicator for a plurality of frequency sampling points, respectively.

As already described above, the test signals are established as CW signals having frequencies that are different from each other. Accordingly, each output signal corresponds to one of the plurality of frequency sampling points.

In general, the signal quality indicator is indicative of a signal quality of the respective output signal. For example, the at least one signal quality indicator may comprise one or more of the following measures for the signal quality of the respective output signal: a signal-to-noise ratio of the respective output signal, clipping of the respective output signal, harmonics in the respective output signal, noise of the respective output signal, jitter of the respective output signal, crosstalk in the respective output signal, distortions of the respective output signal, ringing of the respective output signal, an error vector magnitude of the respective output signal, and/or a ground bounce signature of the respective output signal. Accordingly, the at least one signal quality indicator may be indicative of a signal integrity of the respective output signal.

The processing circuit 26 may further be configured to combine two or more of the signal quality indicators described above by a weighted sum, thereby obtaining a combined signal quality indicator for the plurality of frequency sampling points, respectively.

Further, measurement data associated with the output signals is determined by the processing circuit 26 based on the output signals, for example based on the output signals and based on the reference signal(s) (step S5). The measurement data may comprise an impulse response of the device under test 12, a step response of the device under test 12, an amplitude response of the device under test 12, a phase response of the device under test 12, a frequency response of the device under test 12, and/or a transfer function of the device under test 12.

Optionally, the measurement data and the at least one signal quality indicator may be saved in the memory 28 for later processing by the processing circuit 26 and/or by the visualization circuit 30. In other words, the processing steps described below may be performed in real-time and/or in post-processing.

Figure 3:
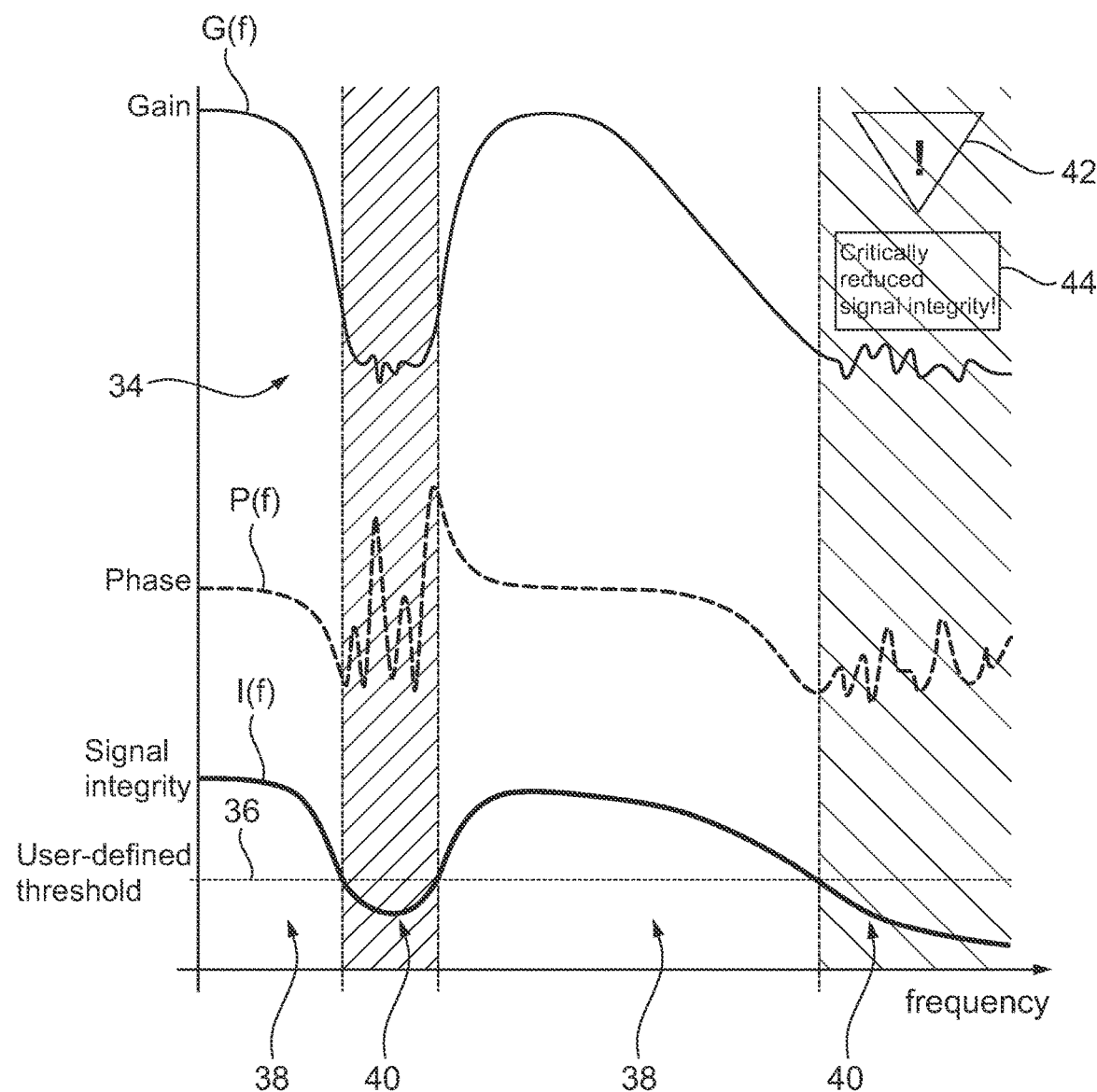
FIG. 3 shows a combined plot of measurement data and of a signal quality indicator.

Visualization data associated with the measurement data and the at least one signal quality indicator is generated by the visualization circuit 30, wherein the visualization data is displayed on the display 32 (step S6). A particular example is illustrated in FIG. 3, wherein the visualization data comprises a Bode plot 34 of the device under test 12 over frequency as well as a plot of the at least one signal quality indicator (or combined signal quality indicator) I(f) over frequency. The Bode plot 34 comprises an amplitude response of the device under test 12 plotted over frequency f, namely the gain G(f). The Bode plot 34 further comprises a phase response P(f) of the device under test 12 plotted over frequency f.

As is illustrated in FIG. 3, the visualization data further comprises a user-defined threshold 36 that may be set by a user via a suitable user interface of the electronic instrument 14. Alternatively, the threshold 36 may be predefined. For example, the threshold 36 may correspond to a default setting.

In general, the user-defined threshold 36 divides the possible values of the at least one signal quality indicator I(f) into two different ranges, namely above and below the user-defined threshold 36. If a value of the at least one signal quality indicator I(f) is above the user-defined threshold 36, this indicates a sufficient signal quality for performing reliable measurements. In other words, the measurement data in the corresponding frequency ranges is reliable.

If a value of the at least one signal quality indicator I(f) is below the user-defined threshold 36, this indicates an insufficient signal quality for performing reliable measurements, i.e. the signal quality of the corresponding output signal(s) is critically reduced. In other words, the measurement data in the corresponding frequency ranges may be unreliable due to a malfunction of the device under test 12 and/or due to faults in the measurement setup.

In the particular example shown in FIG. 3, the visualization data further comprises a color-coded background, wherein a background of the plot of the amplitude response G(f) of the device under test 12, a background of the plot of the phase response P(f) of the device under test 12, and a background of the plot of the at least one signal quality indicator I(f) over the plurality of frequency sampling points has a first color, for example green, in frequency ranges 38 where a value of the at least one signal quality indicator I(f) is above the user-defined threshold 36.

The background of the plot of the amplitude response G(f) of the device under test 12, the background of the plot of the phase response P(f) of the device under test 12, and the background of the plot of the at least one signal quality indicator I(f) over the plurality of frequency sampling points has a second color, for example red, in frequency ranges 40 where a value of the at least one signal quality indicator I(f) is below the user-defined threshold 36.

Alternatively or additionally, a warning sign 42 and/or a text message 44 may be displayed if the value of the at least one signal quality indicator I(f) is below the user-defined threshold 36.

Alternatively or additionally, the plot of the amplitude response G(f) of the device under test 12, the plot of the phase response P(f) of the device under test 12, and/or the plot of the at least one signal quality indicator I(f) over the plurality of frequency sampling points may be color coded, i.e. may have different colors depending on whether a value of the at least one signal quality indicator I(f) is above or below the user-defined threshold 36.

Thus, a user can easily identify portions of the amplitude response G(f) and/or of the phase response P(f) of the device under test 12 that are determined based on portions of the output signal(s) having a low signal quality. Accordingly, the user is assisted in identifying faults in the measurement setup and/or malfunctions of the device under test 12 over the plurality of frequency sampling points.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof.

In an embodiment, circuitry includes hardware circuit implementations (e.g., implementations in analog circuitry, implementations in digital circuitry, and the like, and combinations thereof). In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

In some examples, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implemented the functionality described herein.

Of course, in some embodiments, two or more of these components, or parts thereof, can be integrated or share hardware and/or software, circuitry, etc. In some embodiments, these components, or parts thereof, may be grouped in a single location or distributed over a wide area. In circumstances where the components are distributed, the components are accessible to each other via communication links.

Embodiments of the present disclosure or the functionality thereof may be implemented in various ways, including as non-transitory computer program products. A computer program product may include a non-transitory computer-readable storage medium storing applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably). Such non-transitory computer-readable storage media include all computer-readable media (including volatile and non-volatile media).

Embodiments of the present disclosure may also take the form of an apparatus, system, computing device, computing entity, and/or the like executing instructions stored on computer-readable storage media to perform certain steps or operations. The computer-readable media include cooperating or interconnected computer-readable media, which exist exclusively on a processing or processor system or distributed among multiple interconnected processing or processor systems that may be local to, or remote from, the processing or processor system. However, embodiments of the present disclosure may also take the form of an entirely hardware embodiment performing certain steps or operations.

Some embodiments are described above with reference to block diagrams and/or flowchart illustrations of apparatuses, methods, systems, and/or computer program instructions or program products. It should be understood that each block of any of the block diagrams and/or flowchart illustrations, respectively, or portions thereof, may be implemented in part by computer program instructions, e.g., as logical steps or operations executing on one or more computing devices. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein.

These computer program instructions may also be stored in one or more computer-readable memory or portions thereof, such as the computer-readable storage media described above, that can direct one or more computers or computing devices or other programmable data processing apparatus(es) to function in a particular manner, such that the instructions stored in the computer-readable memory produce an article of manufacture including computer-readable instructions for implementing the functionality specified in the flowchart block or blocks.

The computer program instructions may also be loaded onto one or more computers or computing devices or other programmable data processing apparatus(es) to cause a series of operational steps to be performed on the one or more computers or computing devices or other programmable data processing apparatus(es) to produce a computer-implemented process such that the instructions that execute on the one or more computers or computing devices or other programmable data processing apparatus(es) provide operations for implementing the functions specified in the flowchart block or blocks and/or carry out the methods described herein.

It will be appreciated that the term computer or computing device can include, for example, any computing device or processing structure, including but not limited to a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof.

Accordingly, blocks of the block diagrams and/or flowchart illustrations support various combinations for performing the specified functions, combinations of operations for performing the specified functions and program instructions for performing the specified functions. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure. Further, it will be appreciated that embodiments of the present disclosure may employ any combination of features described herein.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

Throughout this specification, terms of art may be used. These terms are to take on their ordinary meaning in the art from which they come, unless specifically defined herein or the context of their use would clearly suggest otherwise.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An electronic instrument, the electronic instrument comprising:
    a transmitter circuit configured to transmit a test signal to a device under test;
    a receiver circuit configured to receive an output signal from the device under test; and
    a processing circuit configured to determine at least one signal quality indicator based on the output signal received from the device under test, wherein the at least one signal quality indicator is indicative of a signal quality of the output signal,
    wherein the processing circuit is configured to determine measurement data associated with the output signal, and
    wherein the at least one signal quality indicator is indicative of a signal integrity of the output signal, and wherein the signal quality indicator is indicative of which portions of the measurement data are reliable and which portions of the measurement data are unreliable.

2. The electronic instrument of claim 1, wherein the processing circuit is configured to determine the at least one signal quality indicator based on the test signal and the output signal.

3. The electronic instrument of claim 1, wherein the processing circuit is configured to determine the at least one signal quality indicator for a plurality of frequency sampling points, respectively.

4. The electronic instrument of claim 1, further comprising a visualization circuit configured to generate visualization data associated with the at least one signal quality indicator.

5. The electronic instrument of claim 4, further comprising a display configured to display the visualization data generated by the visualization circuit.

6. The electronic instrument of claim 4, wherein the processing circuit is configured to determine the at least one signal quality indicator for a plurality of frequency sampling points, and wherein the visualization data comprises a plot of the at least one signal quality indicator over the plurality of frequency sampling points.

7. The electronic instrument of claim 4, wherein the visualization data further comprises information on the measurement data.

8. The electronic instrument of claim 7, wherein the processing circuit is configured to determine the at least one signal quality indicator for a plurality of frequency sampling points, wherein the visualization data comprises a plot of the at least one signal quality indicator over the plurality of frequency sampling points, and wherein the visualization data comprises a Bode plot associated with the measurement data.

9. The electronic instrument of claim 4, wherein the visualization data comprises at least one of a predefined threshold, a user-defined threshold, a color-coded background, a color-coded graph, a text message, or a warning sign.

10. The electronic instrument of claim 1, further comprising a memory configured to save the at least one signal quality indicator as well as the measurement data associated with the output signal.

11. The electronic instrument of claim 1, wherein the electronic instrument is an oscilloscope.

12. The electronic instrument of claim 1, wherein the at least one signal quality indicator comprises a signal-to-noise ratio.

13. A signal analysis method of analyzing a signal received from a device under test, the signal analysis method comprising the following steps:
    transmitting, by a transmission circuit of an electronic instrument, a test signal to a device under test;
    processing, by the device under test, the test signal, thereby generating an output signal;
    receiving, by a receiver circuit of the electronic instrument, the output signal of the device under test;
    processing, by a processing circuit of the electronic instrument, the output signal, thereby obtaining at least one signal quality indicator, wherein the at least one signal quality indicator is indicative of a signal quality of the output signal; and
    determining, by the processing circuit, measurement data associated with the output signal, wherein the at least one signal quality indicator is indicative of a signal integrity of the output signal, and wherein the signal quality indicator is indicative of which portions of the measurement data are reliable and which portions of the measurement data are unreliable.

14. The signal analysis method of claim 13, wherein the at least one signal quality indicator is determined based on the test signal and the output signal.

15. The signal analysis method of claim 13, wherein the at least one signal quality indicator is determined for a plurality of frequency sampling points.

16. The signal analysis method of claim 13, wherein visualization data associated with the at least one signal quality indicator is determined by a visualization circuit of the electronic instrument.

17. The signal analysis method of claim 16, wherein the visualization data further comprises information on the measurement data.

18. The signal analysis method of claim 17, wherein the at least one signal quality indicator is determined for a plurality of frequency sampling points, wherein the visualization data comprises a plot of the at least one signal quality indicator over the plurality of frequency sampling points, and wherein the visualization data comprises a Bode plot associated with the measurement data.

19. An electronic instrument, the electronic instrument comprising:
  a transmitter circuit configured to transmit a test signal to a device under test;
  a receiver circuit configured to receive an output signal from the device under test;
  a processing circuit configured to determine at least one signal quality indicator based on the output signal received from the device under test, wherein the at least one signal quality indicator is indicative of a signal quality of the output signal, wherein the processing circuit is configured to determine measurement data associated with the output signal, wherein the at least one signal quality indicator is indicative of a signal integrity of the output signal; and
  a visualization circuit configured to generate visualization data associated with the at least one signal quality indicator, wherein the visualization data further comprises information on the measurement data, such that the measurement data is visualized together with the at least one signal quality indicator.

\* \* \* \* \*